(12) United States Patent
Jeong et al.

(10) Patent No.: US 7,701,771 B2
(45) Date of Patent: Apr. 20, 2010

(54) MEMORY DEVICE INCLUDING 3-DIMENSIONALLY ARRANGED MEMORY CELL TRANSISTORS AND METHODS OF OPERATING THE SAME

(75) Inventors: Jae-Hun Jeong, Suwon-si (KR); Ki-Nam Kim, Seoul (KR); Soon-Moon Jung, Seongnam-si (KR); Hoo-Sung Cho, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 234 days.

(21) Appl. No.: 11/882,769

(22) Filed: Aug. 6, 2007

(65) Prior Publication Data
US 2008/0031048 A1 Feb. 7, 2008

(30) Foreign Application Priority Data
Aug. 4, 2006 (KR) .................. 10-2006-0073858

(51) Int. Cl.
*G11C 11/03* (2006.01)
(52) U.S. Cl. .................. 365/185.18; 365/185.17; 365/185.26; 365/185.33
(58) Field of Classification Search ............ 365/185.17, 365/185.18, 185.33, 185.26
See application file for complete search history.

(56) References Cited

U.S. PATENT DOCUMENTS

| | | | |
|---|---|---|---|
| 5,321,286 A | 6/1994 | Koyama et al. | |
| 5,429,968 A | 7/1995 | Koyama | |
| 6,026,021 A * | 2/2000 | Hoang | 365/185.11 |
| 6,545,892 B2 * | 4/2003 | Takano et al. | 365/51 |
| 7,084,440 B2 * | 8/2006 | Sel et al. | 257/208 |
| 7,315,472 B2 * | 1/2008 | Lee | 365/185.17 |

FOREIGN PATENT DOCUMENTS

| | | |
|---|---|---|
| JP | 05-021758 | 1/1993 |
| JP | 05-036989 | 2/1993 |
| JP | 2001-308209 | 11/2001 |
| KR | 1996-0012059 | 6/1993 |
| KR | 1996-0005561 | 4/1996 |
| KR | 1020030055390 A | 7/2003 |
| KR | 1020060037562 A | 5/2006 |
| KR | 1020060057821 A | 5/2006 |
| KR | 1020060098044 A | 9/2006 |

* cited by examiner

*Primary Examiner*—Pho M. Luu
(74) *Attorney, Agent, or Firm*—Harness, Dickey & Pierce, P.L.C.

(57) ABSTRACT

A memory device may include L semiconductor layers, a gate structure on each of the semiconductor layers, N bitlines, and/or a common source line on each of the semiconductor layers. The L semiconductor layers may be stacked, and/or L may be an integer greater than 1. The N bitlines may be on the gate structures and crossing over the gate structures, and/or N may be an integer greater than 1. Each of the common source lines may be connected to each other such that the common source lines have equipotentiality with each other.

16 Claims, 13 Drawing Sheets

Fig. 1C

| Element | | PROGRAM | ERASE | READ |
|---|---|---|---|---|
| Selected WL | WL(i,j) | $V_{PGM}$ | 0 | 0 |
| Unselected WL | WL(I',J) | $V_{PASS}$ | Floating | $V_{READ}$ |
| Selected BL | BL(k) | 0 | Floating | $V_{PCHR}$ |
| Unselected BL | BL(K) | $V_{CC}$ | - | - |
| Selected SSL | SSL(i) | $V_{CC}$ | Floating | $V_{READ}$ |
| Selected GSL | GSL(i) | 0 | Floating | $V_{READ}$ |
| Unselected SSL | SSL(I) | 0 | Floating | 0 |
| Unselected GSL | GSL(I) | 0 | Floating | 0 |
| CSL | CSL | $V_{CSL}$ | Floating | 0 |
| Selected Semiconductor Layer | $i^{th}$ Semiconductor Layer | 0 | $V_{ERS}$ | 0 |
| I' | $1 \leq I' \leq L$, I' being a positive integer | | | |
| I | $1 \leq I \leq L$, I being a positive integer, not i | | | |
| J | $1 \leq J \leq M$, J being a positive integer, not j | | | |
| K | $1 \leq K \leq N$, K being a positive integer, not k | | | |

Fig. 2C

| Element | | PROGRAM | ERASE | READ |
|---|---|---|---|---|
| Selected WL | WL(j) | $V_{PGM}$ | 0 | 0 |
| Unselected WL | WL(J) | $V_{PASS}$ | Floating | $V_{READ}$ |
| Selected BL | BL(k) | 0 | Floating | $V_{PCHR}$ |
| Unselected BL | BL(K) | $V_{CC}$ | – | – |
| Selected SSL | SSL(i) | $V_{CC}$ | Floating | $V_{READ}$ |
| Selected GSL | GSL(i) | 0 | Floating | $V_{READ}$ |
| Unselected SSL | SSL(I) | 0 | Floating | 0 |
| Unselected GSL | GSL(I) | 0 | Floating | 0 |
| CSL | CSL | $V_{CSL}$ | Floating | 0 |
| Selected Semiconductor Layer | $i^{th}$ Semiconductor Layer | 0 | $V_{ERS}$ | 0 |
| I | $1 \leq I \leq L$, I being a positive integer, not i | | | |
| J | $1 \leq J \leq M$, J being a positive integer, not j | | | |
| K | $1 \leq K \leq N$, K being a positive integer, not k | | | |

Fig. 3C

| Element | | PROGRAM | ERASE | READ |
|---|---|---|---|---|
| Selected WL | WL(i,j) | $V_{PGM}$ | 0 | 0 |
| Unselected WL | WL(I',J) | $V_{PASS}$ | Floating | $V_{READ}$ |
| Selected BL | BL(k) | 0 | Floating | $V_{PCHR}$ |
| Unselected BL | BL(K) | $V_{CC}$ | - | - |
| SSL | SSL | $V_{CC}$ | Floating | $V_{READ}$ |
| GSL | GSL | 0 | Floating | $V_{READ}$ |
| CSL | CSL | $V_{CSL}$ | Floating | 0 |
| Selected Semiconductor Layer | $i^{th}$ Semiconductor Layer | 0 | $V_{ERS}$ | 0 |
| I' | $1 \leq I' \leq L$, I' being a positive integer | | | |
| J | $1 \leq J \leq M$, J being a positive integer, not j | | | |
| K | $1 \leq K \leq N$, K being a positive integer, not k | | | |

MEMORY DEVICE INCLUDING 3-DIMENSIONALLY ARRANGED MEMORY CELL TRANSISTORS AND METHODS OF OPERATING THE SAME

PRIORITY STATEMENT

This U.S. non-provisional patent application claims the benefit of priority under 35 U.S.C § 119 to Korean Patent Application 10-2006-0073858 filed on Aug. 4, 2006, the entire contents of which are incorporated herein in their entirety by reference.

BACKGROUND

1. Field

Example embodiments relate to semiconductor devices and/or methods of operating the same. For example, example embodiments are directed to a NAND flash memory device including 3-dimensionally arranged memory cell transistors and/or methods of operating the same.

2. Description of Related Art

Many electronic appliances include semiconductor devices including electronic elements, for example, transistors, resistors, and capacitors. The electronic elements are integrated on a semiconductor substrate after being designed to execute functions of the electronic appliances. For example, computers or digital cameras include semiconductor devices, for example, memory chips for storing data, processing chips for processing data, and so forth. The memory chips and the processing chips include electronic elements integrated on a semiconductor substrate.

A higher integration level for semiconductor devices is required to meet the higher performance and lower cost requirements of users. However, the development of advanced processing technologies is necessary to achieve a higher integration level for semiconductor devices. Increases in the integration level of semiconductor devices are limited because the development of advanced processing technologies incurs enormous expense and longer time.

In spite of the restrictions in advancing techniques for forming finer patterns, a reduction of the channel length of a cell transistor is limited by an issue of leakage current for semiconductor devices, e.g., flash memory devices. A cell current of a programmed cell transistor, during a read operation of the flash memory, should be lower than a desired, or alternatively, a predetermined reference current. However, the unintended leakage current of the cell transistor increases with a decrease in size of the cell transistor. The leakage current is a kind of short channel effect which appears if gate line width and channel length of the flash memory are reduced. The leakage current makes determining whether the cell transistor of the flash memory is programmed more difficult. Accordingly, a unit cell area of the flash memory (for example, channel length of the cell transistor) may not be further reduced without suppressing the leakage current of the cell transistor.

A conventional NAND flash memory device includes a string selection transistor, a ground selection transistor, and a plurality of cell transistors disposed therebetween. A conventional NAND flash memory device has a higher integration level among conventional existing semiconductor devices. With an increase in a number of cell transistors disposed between the two selection transistors, the area occupied by the selection transistors in an entire cell array region becomes smaller. Accordingly, the integration level of the flash memory may become higher with the decrease in the area occupied by the selection transistors.

However, conventional NAND flash memory devices suffer from not only the limitation resulting from leakage current but also from the limitation of a lower sensible current which interferes with an increase in integration level. If serially connected cell transistors continue to increase in number, electric resistance thereof increases during a read operation. Accordingly, read current at a desired, or alternatively, a predetermined cell becomes lower than a magnitude capable of being sensed by a sensing circuit. In this case, because the cell may not be normally read, the number of cell transistors disposed between the selection transistors is limited to 32 in most NAND flash memory devices. Therefore, the limitation of the lower sensible current makes reducing the area occupied by the selection transistors in the NAND flash memory more difficult.

SUMMARY

Exemplary embodiments are directed to a memory device. The memory device may include L semiconductor layers, a gate structure on each of the semiconductor layers, N bitlines, and/or a common source line on each of the semiconductor layers. The L semiconductor layers may be stacked, and/or L may be an integer greater than 1. The N bitlines may be on the gate structures and crossing over the gate structures, and/or N may be an integer greater than 1. Each of the common source lines may be connected to each other such that the common source lines have equipotentiality with each other.

BRIEF DESCRIPTION OF THE DRAWINGS

The above and/or other aspects and advantages will become more apparent and more readily appreciated from the following detailed description of example embodiments taken in conjunction with the accompanying drawings of which:

FIGS. 1A through 5A are perspective views of NAND flash memory devices according to example embodiments, respectively.

FIGS. 1B through 5B are equivalent circuit diagrams illustrating NAND flash memory devices according to example embodiments, respectively.

FIGS. 1C through 3C are bias condition tables illustrating methods of operating NAND flash memory devices according to example embodiments, respectively.

DETAILED DESCRIPTION OF EXAMPLE EMBODIMENTS

Figure 1A:
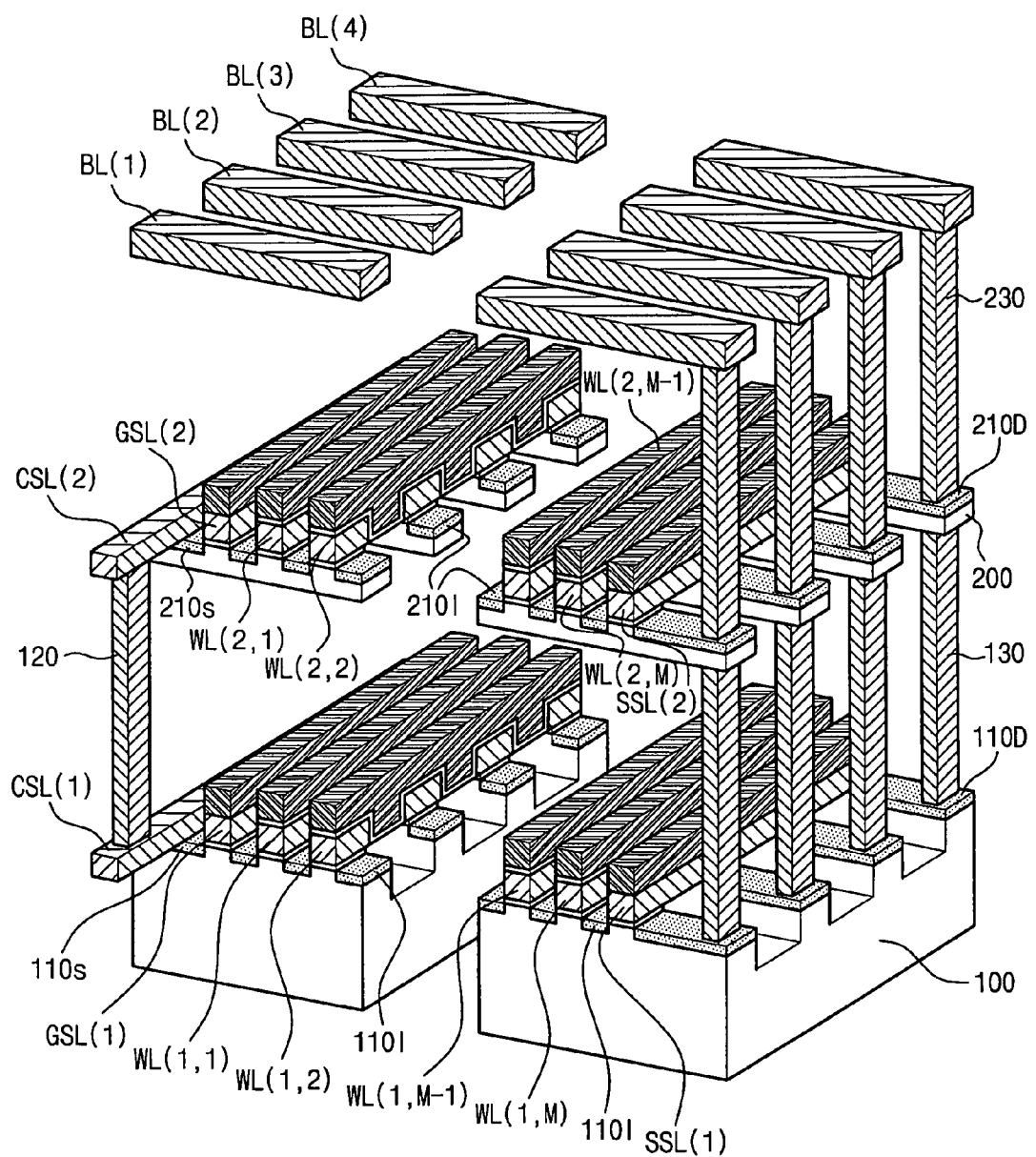

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

FIGS. 1A through 5A are perspective views of NAND flash memory devices according to example embodiments, respectively. FIGS. 1B through 5B are equivalent circuit diagrams illustrating the NAND flash memory devices of FIGS. 1A through 5A, respectively.

A NAND flash memory device according to example embodiments may include 3-dimensionally arranged memory cells. The memory cells may be formed on stacked semiconductor layers to the number of L, which may be used as a semiconductor substrate for forming MOS transistors. The number L of the semiconductor layers may be an integer greater than 1. For the convenience of description, only two semiconductor layers (i.e., a first semiconductor layer 100 and a second semiconductor layer 200) are illustrated in FIGS. 1A through 5A. However, a number L of semiconductor layers in example embodiments may be 2 or greater, e.g., as illustrated in FIGS. 1B through 5B.

According to an example embodiment, the first semiconductor layer 100 may be a single-crystalline silicon wafer and the second semiconductor layer 200 may be a single-crystalline silicon epitaxial layer formed by means of an epitaxial process using the first semiconductor layer (e.g., wafer) 100 as a seed layer. Methods of forming an epitaxial semiconductor layer on a semiconductor wafer by means of an epitaxial process are well known in the art, and these methods may be used for example embodiments.

According to example embodiments, the semiconductor layers 100 and 200 may include cell arrays with substantially the same structure, and/or the memory cells may constitute multi-layered cell arrays. For clarity of description, various elements of the cell arrays may be identified by parenthetical reference to the corresponding semiconductor layer. For example, a ground selection line GSL on the first semiconductor layer 100 may be referred to as a ground selection line GSL(1). Similarly, a string selection line SSL on the second semiconductor layer 200 may be referred to as the string selection line SSL(2). If a plurality of elements is disposed on a particular layer, the parenthetical reference may include another identifying element. For example, a plurality of word lines WL may be disposed on a semiconductor layer. An $a^{th}$ word line WL disposed on the second semiconductor layer 200 may be referred to as a word line WL(2, a). If the parenthetical reference need not refer to a particular semiconductor layer, the element for the semiconductor layer may be omitted. For example, a $c^{th}$ bit line BL may be referred to as a bit line BL(c).

Each of the semiconductor layers 100 and 200 may include active regions defined by device isolation patterns (not shown). The active regions may be arranged in parallel with one another and/or extend in one direction. The device isolation patterns may be made of insulating materials including silicon oxide and/or electrically isolate the active regions.

A gate structure may be disposed on the respective semiconductor layers 100 and 200 to cross over the active regions. The gate structure of each respective semiconductor layer may include a pair of selection lines, e.g., a ground selection line GSL and a string selection line SSL, and M wordlines WL. A common source line CSL may be disposed at one side of the gate structure in parallel with the wordlines WL, and/or bitline plugs 130 and 230 may be disposed at the other side of the gate structure. The bitline plugs 130 and 230 may be connected to each of N bitlines BL crossing the wordlines WL. The bitlines BL may be formed to cross the wordlines WL over the uppermost semiconductor layer (e.g., the second semiconductor layer 200 illustrated in FIG. 1A). The number N of the bitlines BL may be a positive integer greater than 1.

The wordlines WL may be disposed between the selection lines, e.g., a ground selection line GSL and a string selection line SSL, and/or the number M of the wordlines WL constituting one gate structure may be a positive integer greater than 1. One of the selection lines may be used as a ground selection line GSL for controlling an electric connection of the common source line CSL and/or memory cells, and/or the other selection line may be used as a string selection line SSL for controlling an electric connection of bitlines BL and/or memory cells.

Impurity regions may be formed in an active region between the selection lines, e.g., the ground selection line GSL and the string selection line SSL, and the wordlines WL. Impurity regions 110S and 210S formed at one side of the ground selection line GSL may be used as source regions connected by the common source line CSL, and/or impurity regions 110D and 210D formed at one side of the string selection line SSL are used as drain regions connected to the bitlines BL through the bitline plugs 130 and 230. Impurity regions formed at opposite sides of the wordlines WL are used as internal impurity regions 110I and 210I for serially connecting the memory cells.

Figure 1B:
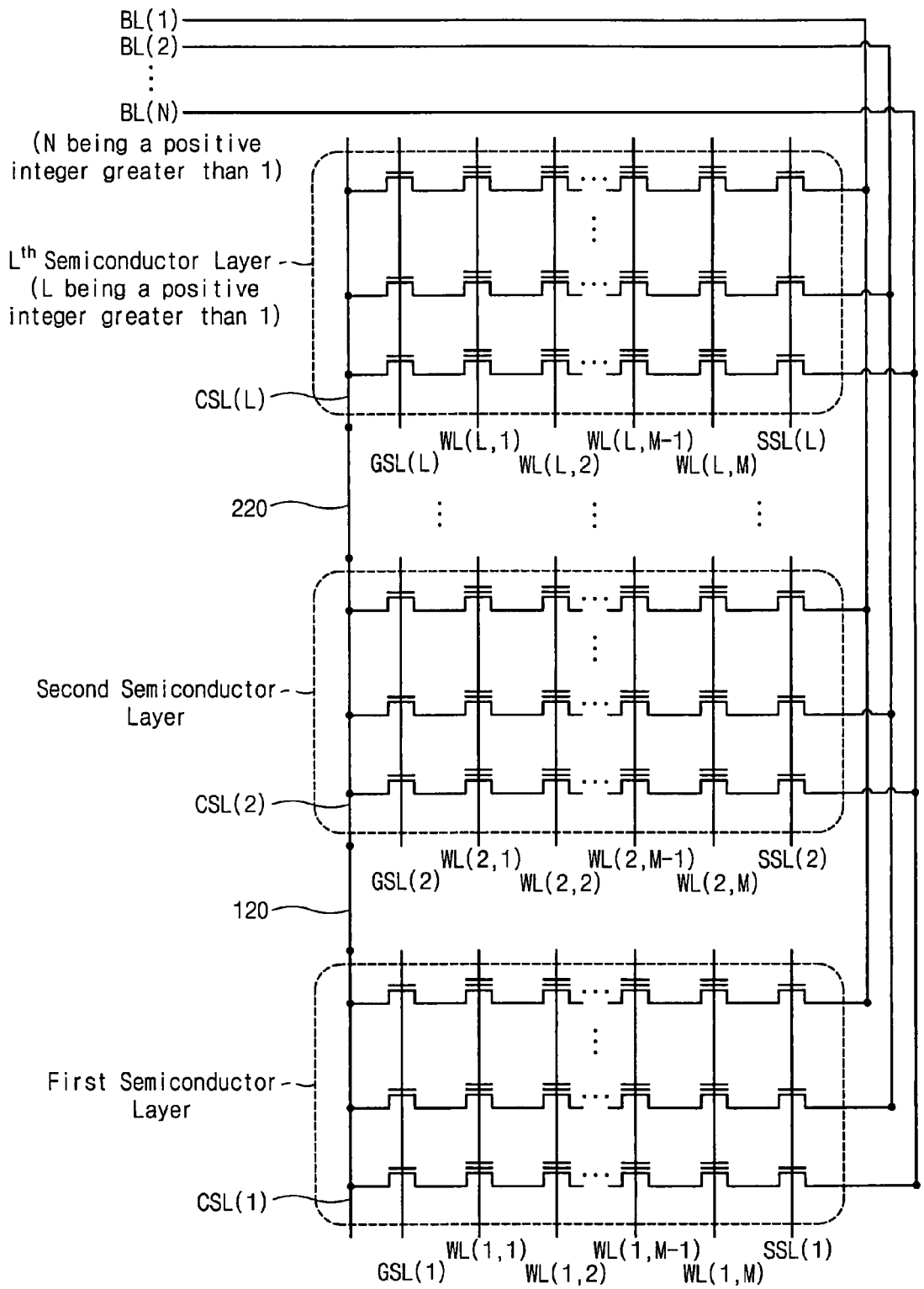

In an example embodiment, as illustrated in FIGS. 1A and 1B, source plugs 120 and 220 may be disposed between the semiconductor layers 100 and 200 to electrically connect the common source lines CSL(1) and CSL(2) to each other. Therefore, the common source lines CSL(1) and CSL(2) may be in an equipotential state. However, in an example embodiment as illustrated in FIGS. 1A and 1B, wordlines WL and selection lines, e.g., GSL and SSL, formed on a desired, or alternatively, a predetermined semiconductor layer may not be directly connected to wordlines WL and selection lines, e.g., GSL and SSL, formed on another semiconductor layer.

Figure 2A:
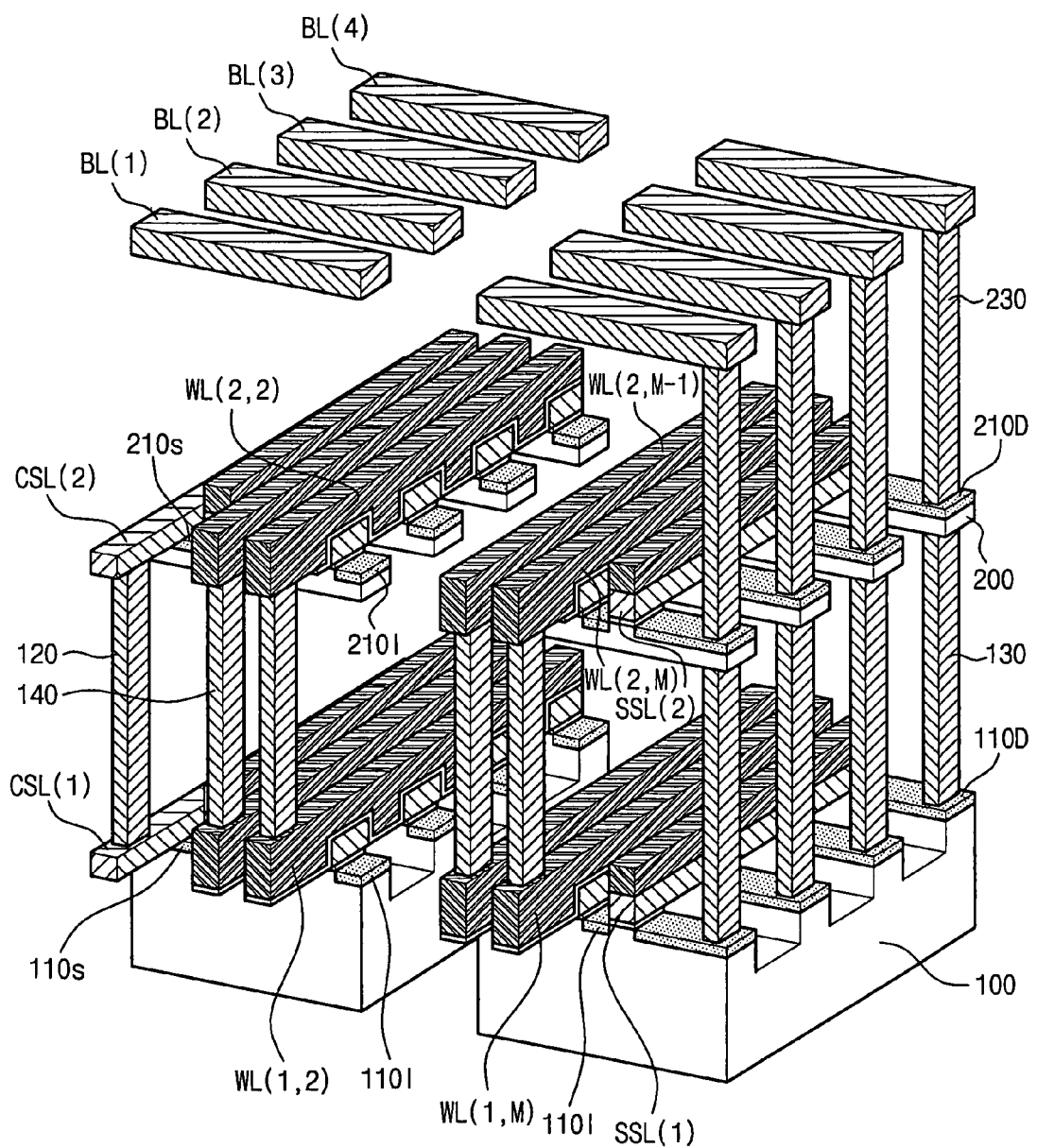
Figure 2B:
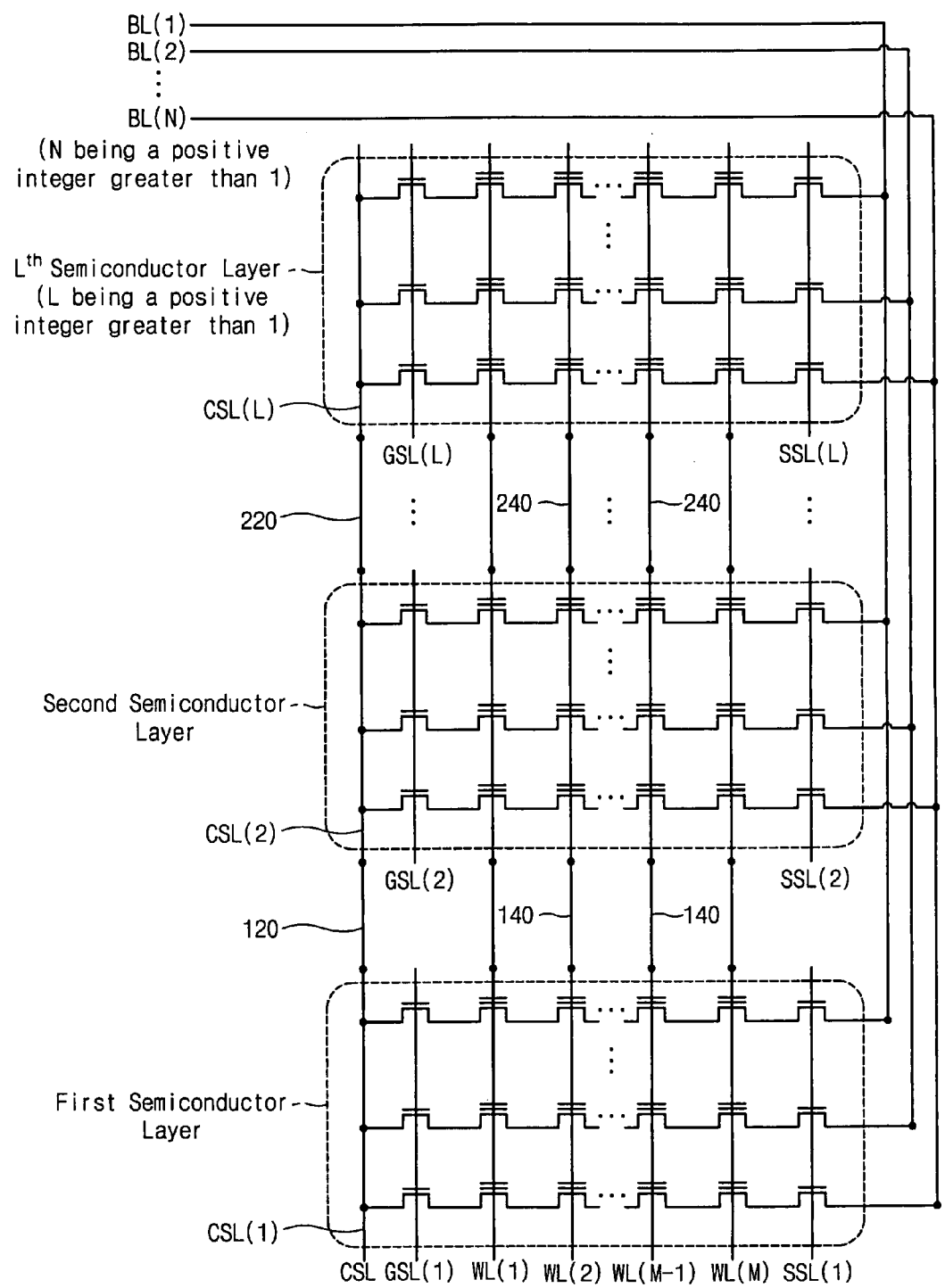

In another example embodiment, as illustrated in FIGS. 2A and 2B, source plugs 120 and 220 and/or wordline plugs 140 and 240 may be disposed between the semiconductor layers 100 and 200. The source plugs 120 and 220 may be formed to electrically connect the common source lines CSL(1) and CL(2) to each other, and/or the wordline plugs 140 and 240 may be formed to electrically connect the wordlines WL to each other. Wordline plugs may be disposed on an $i^{th}$ semiconductor layer to electrically connect WL(i, X) to WL(i+1, X) (i being a positive integer between 1 and L, and X being a positive integer between 1 and M). Therefore, the common source lines CSL(1) and CSL(2) may have equipotentiality, and/or a wordline formed on a desired, or alternatively, a predetermined semiconductor layer and a corresponding wordline formed on another semiconductor layer may have equipotentiality. However, in an example embodiment as illustrated in FIGS. 2A and 2B, selection lines, e.g., the GSL and the SSL, formed on a desired, or alternatively, a predetermined semiconductor layer may not be directly connected to selection lines, e.g., the GSL and the SSL, formed on another semiconductor layer.

Figure 3A:
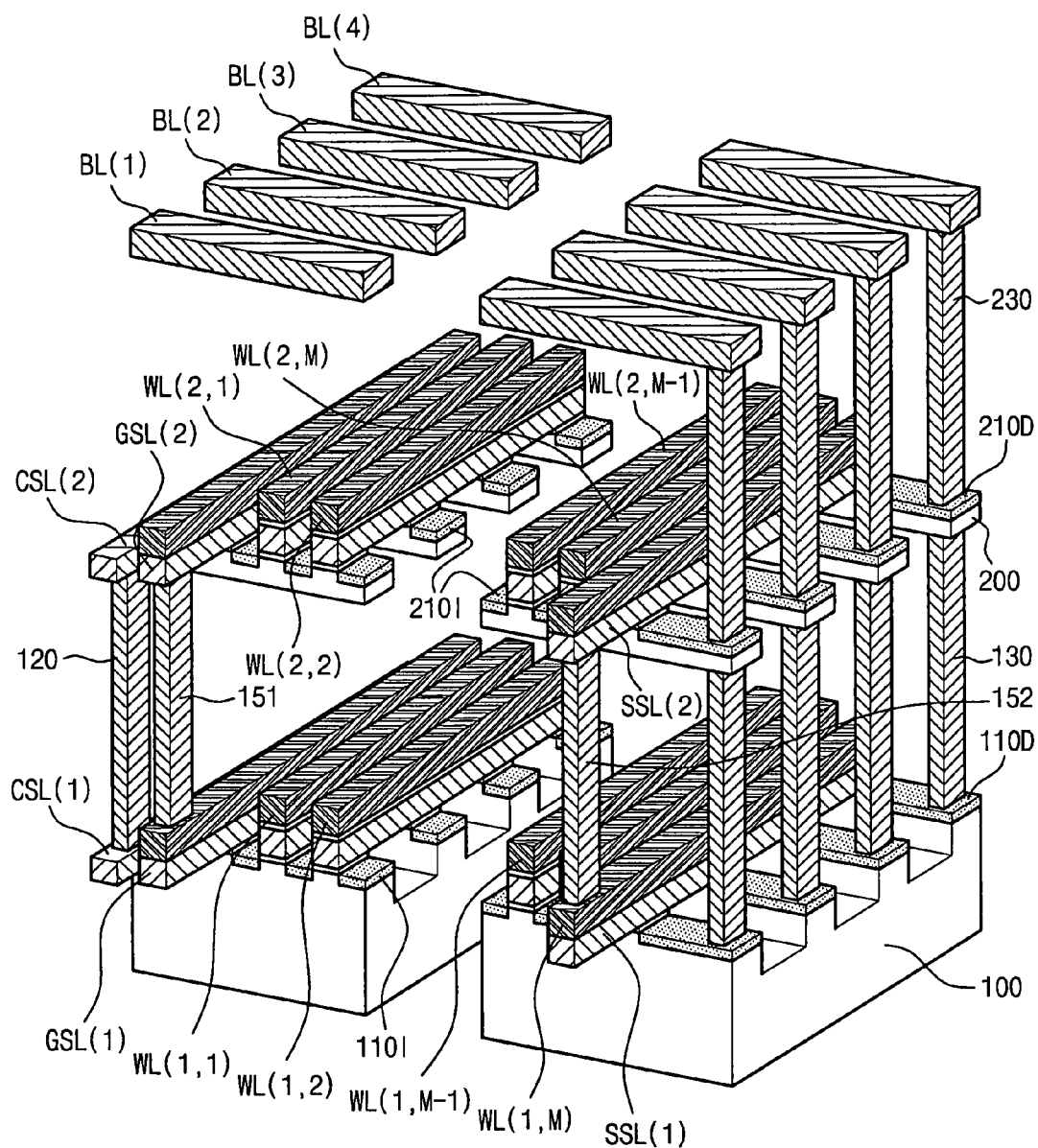
Figure 3B:
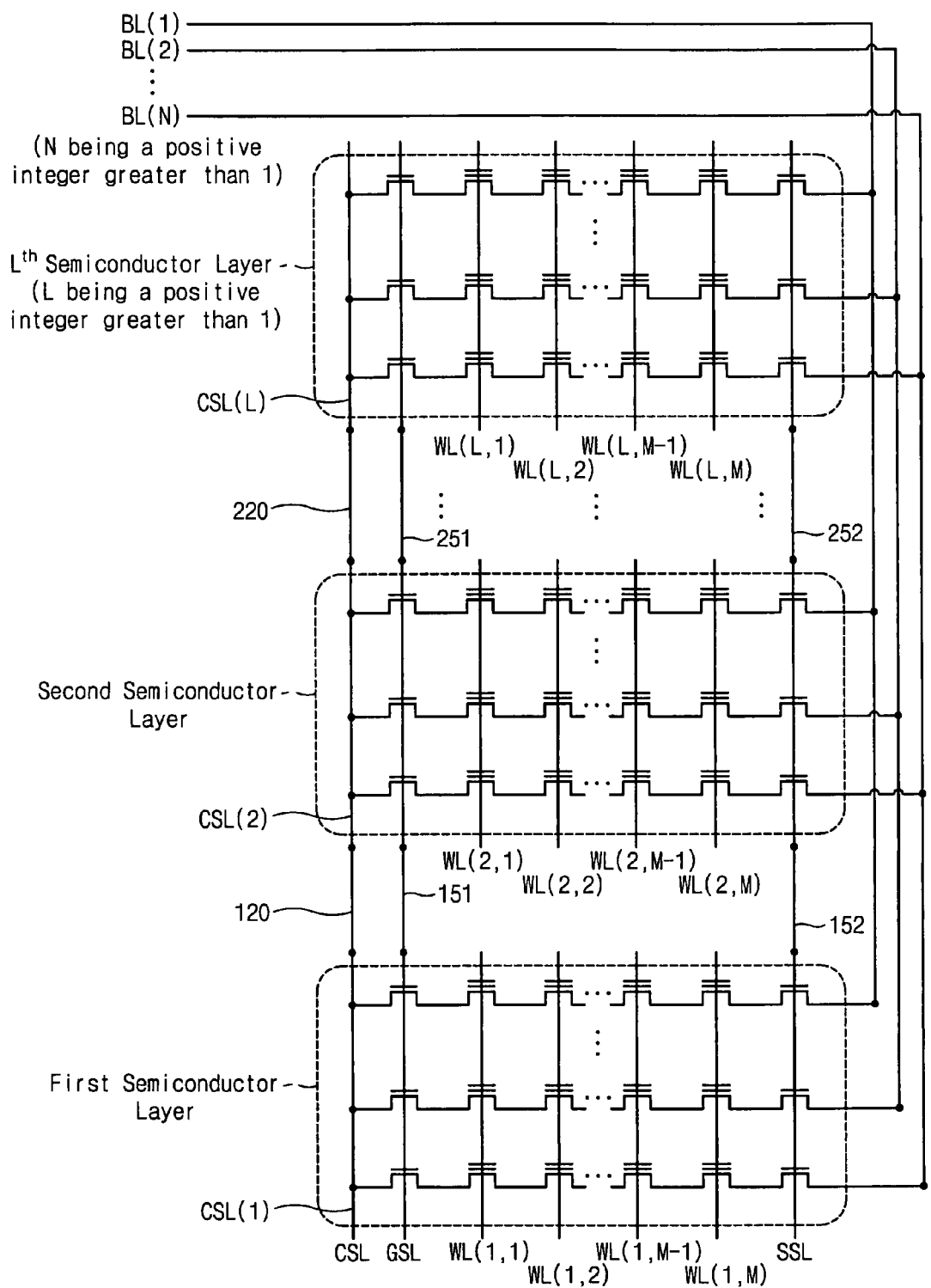

In still another example embodiment, as illustrated in FIGS. 3A and 3B, source plugs 120 and 220, GSL plugs 151 and 152, and/or SSL plugs 152 and 252 may be disposed between the semiconductor layers 100 and 200 (for example, to electrically interconnect common source lines CSL(1) and CSL(2), ground selection lines GSL(1) and GSL(2), and/or string selection lines SSL(1) and SSL(2) which are disposed on different semiconductor layers, respectively). For example, a GSL plug disposed on an $i^{th}$ semiconductor layer may electrically connect GSL(i) to GSL(i+1), and/or an SSL plug disposed on the $i^{th}$ semiconductor layer may electrically connect SSL(i) to SSL(i+1). Therefore, the common source lines CSL(1) and CSL(2) may have equipotentiality, the ground selection lines GSL(1) and GSL(2) may have equipotentiality, and/or the string selection lines SSL(1) and SSL(2) may have equipotentiality. However, in an example embodiment as illustrated in FIGS. 3A and 3B, word lines WL formed on a desired, or alternatively, a predetermined semiconductor layer may not be directly connected to word lines WL formed on another semiconductor layer.

FIGS. 1C through 3C are tables of example voltage conditions for explaining a method of operating NAND flash memory devices illustrated in FIGS. 1A through 3A according to example embodiments. For example, FIGS. 1C through 3C disclose conditions of program, erase, and read operations for a memory cell selected by a $j^{th}$ wordline and a $k^{th}$ bitline of an $i^{th}$ semiconductor layer (e.g., see "TABLE 1" below).

TABLE 1

|  | the total number of semiconductor layers | the number of wordlines formed at each semiconductor layer | the number of bitlines |
|---|---|---|---|
| total number | L (L being an integer greater than 1) | M (M being an integer greater than 1) | N (N being an integer greater than 1) |
|  | selected semiconductor layer | selected wordline | selected bitline |
| position of selected cell | $i^{th}$ (1 ≤ i ≤ L, i being an integer) | $j^{th}$ (1 ≤ j ≤ M, j being an integer) | $k^{th}$ (1 ≤ k ≤ N, k being an integer) |

Referring to FIG. 1C, to program a selected memory cell, a program voltage $V_{PGM}$ may be applied to a selected wordline WL(i, j), a voltage of 0 volts may be applied to a selected bitline BL(k) and a selected ground selection line GSL(i), a turn-on voltage $V_{ON}$ may be applied to a selected string selection line SSL(i), and/or a pass voltage $V_{PASS}$ may be applied to unselected wordlines WL(I', J) (I' being an integer between 1 and L, and J being an integer between 1 and M and not j).

The program voltage $V_{PGM}$ may be a voltage between 10 and 20 volts, and/or the turn-on voltage $V_{ON}$ may be a power supply voltage $V_{CC}$. The pass voltage may have a magnitude between the program voltage $V_{PGM}$ and a lower voltage capable of turning on memory cell transistors.

Because the turn-on voltage $V_{ON}$ and the pass voltage $V_{PASS}$ are applied to the selected string selection line SSL(i) and the unselected wordlines WL(I', J), respectively, the channel region of a selected memory cell may have equipotentiality (e.g., 0 volts) with the selected bitline BL(k). Because a sufficiently higher voltage $V_{PGM}$ is applied to the selected wordline WL(i, j), the selected memory cell may be programmed by a tunneling phenomenon.

A same voltage as the voltage applied to the selected string selection line SSL(i) may be applied to unselected bitlines BL(K) so that memory cells defined by the selected wordline WL(i, j) and the unselected bitlines BL(K) may not be programmed (K being an integer between 1 and N, not k). For example, because the selected string selection line SSL(i) and the unselected bitlines BL(K) do not have a potential difference, string selection transistors connected to the unselected bitlines BL(K) may be turned off. Because a voltage of 0 volts may be applied to the selected and unselected ground selection lines GSL(i) and GSL(I), as illustrated in FIG. 1C, ground selection transistors may all be turned off. Accordingly, channel regions of memory cells defined by a selected wordline WL(i, j) and unselected bitlines BL(K) may not be electrically connected to the unselected bitlines BL(K) or the common source lines CSL, and instead may float. For example, the channel regions of memory cells defined by a selected wordline WL(i, j) and unselected bitlines BL(K) may be boosted by the program voltage $V_{PGM}$ to reduce undesired programming for unselected memory cells.

According to example embodiments, a plurality of memory cells may be erased simultaneously. For example, a voltage of 0 volts and an erase voltage $V_{ERS}$ may be applied to a selected wordline WL(i, j) and an $i^{th}$ semiconductor layer, respectively. The erase voltage $V_{ERS}$ may be a voltage between 10 and 20 volts.

In an example embodiment, an equivalent well bias may be applied to all of the semiconductor layers during the erasure of the memory cells. For example, well plugs 170, 270, and 370 may be disposed between the semiconductor layers to connect the semiconductor layers to an upper interconnection 400, as illustrated in FIGS. 4A and 4B.

Figure 5A:
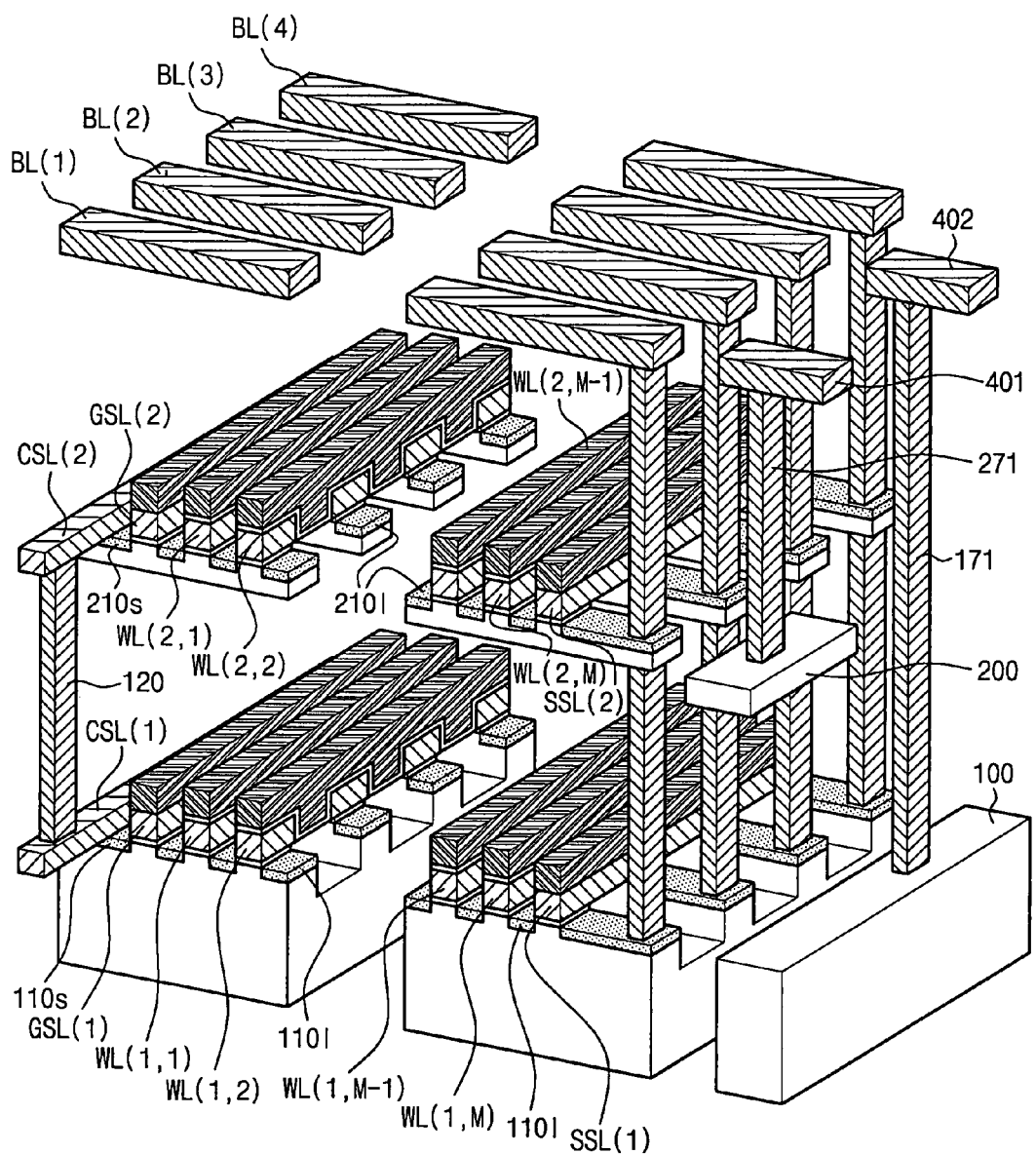
Figure 5B:
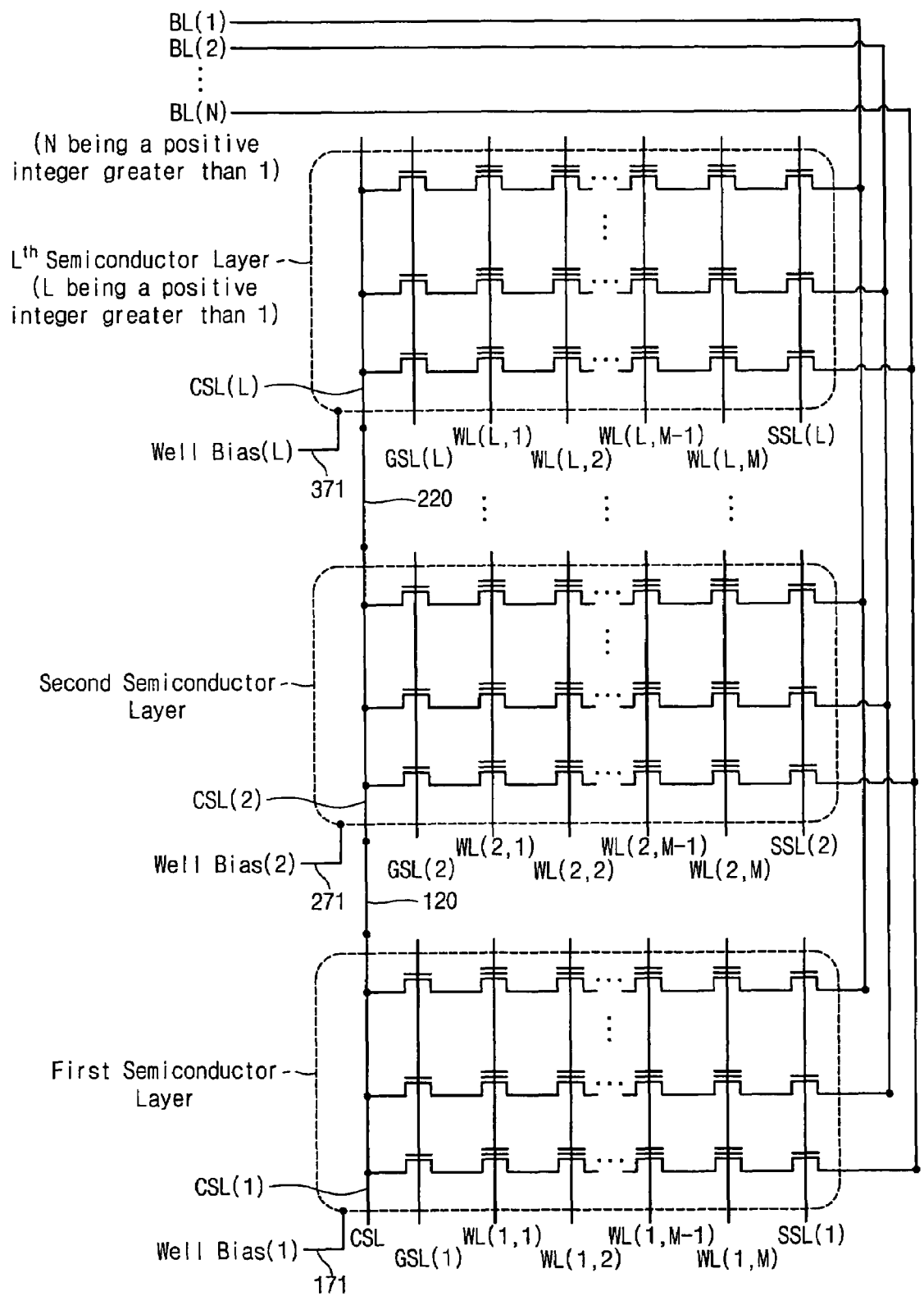

In another example embodiment, different well biases may be applied to the semiconductor layers, respectively. For example, the semiconductor layers may be connected to different interconnections 401 and 402 by means of different well plugs 171, 271, and 371, respectively, as illustrated in FIGS. 5A and 5B. To relieve technical difficulties which may occur during a fabricating process, the well plug 171 connected to the first semiconductor layer 100 may include a plurality of unit plugs stacked sequentially and at least one of conductive pad pattern therebetween.

Figure 4A:
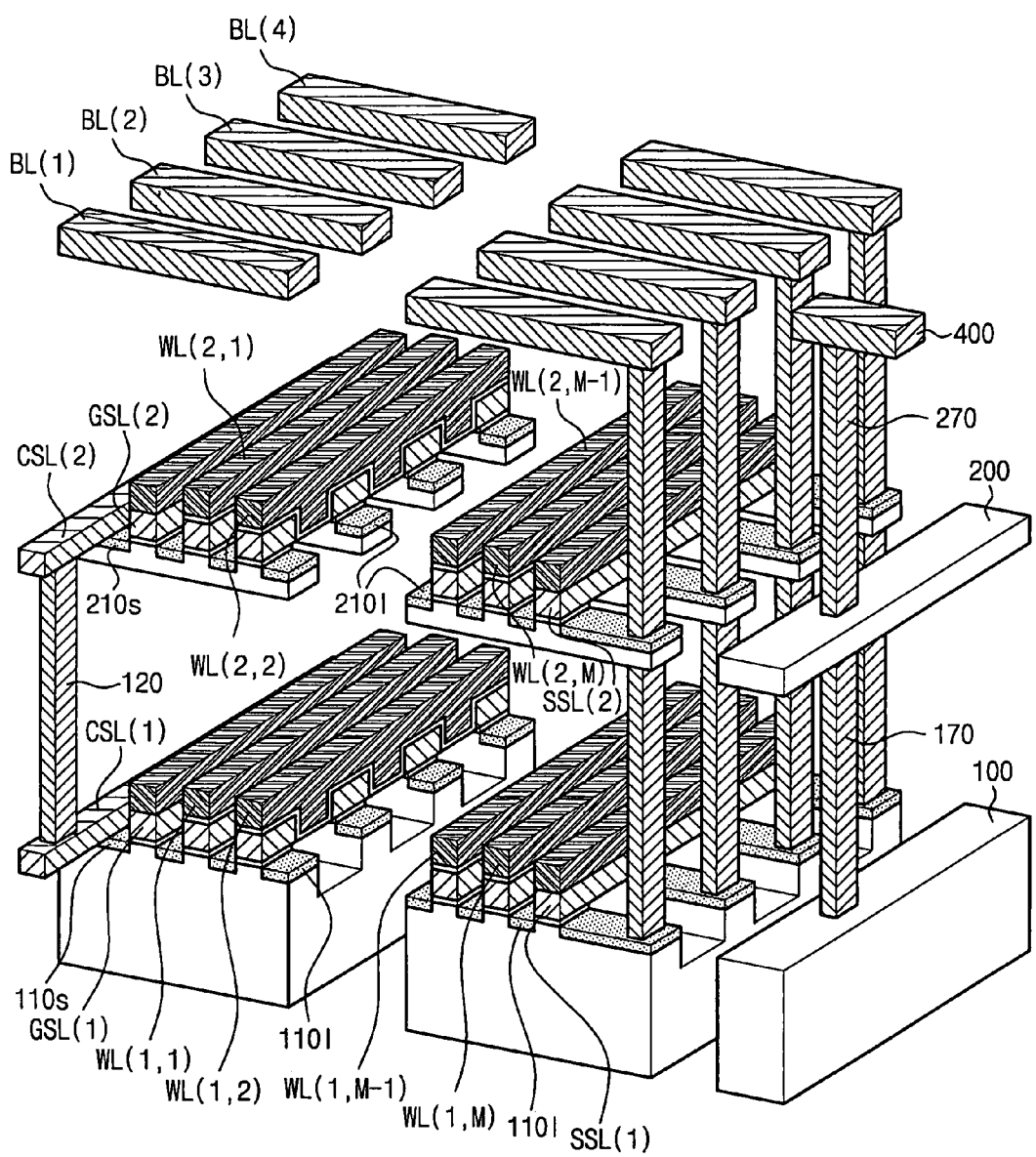
Figure 4B:
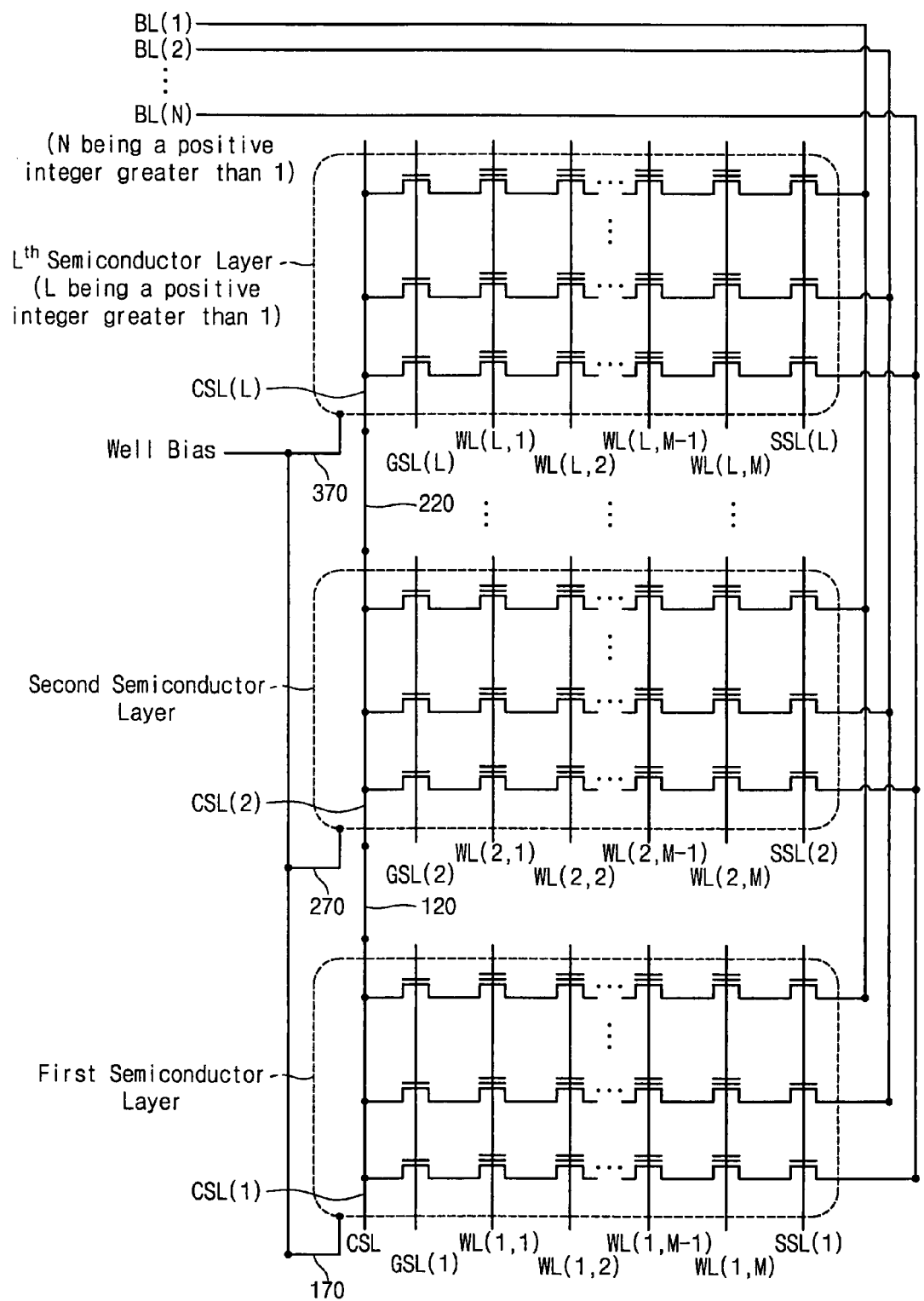

A NAND flash memory device according to an example embodiment illustrated in FIGS. 4A and 4B may have a higher operating speed than a NAND flash memory device according to an example embodiment illustrated in FIGS. 5A and 5B, because memory cells of multiple semiconductor layers may be erased simultaneously in the NAND flash memory device illustrated in FIGS. 4A and 4B. The NAND flash memory device illustrated in FIGS. 5A and 5B may perform an erase operation more stably than the NAND flash memory device illustrated in FIGS. 4A and 4B, because memory cells of respective semiconductor layers may be erased sequentially in the NAND flash memory device illustrated in FIGS. 5A and 5B. For example, an erase uniformity may be deteriorated if a higher number of memory cells are erased, but the erase uniformity may be more easily improved if memory cells of respective semiconductor layers are erased sequentially. The NAND flash memory device may more readily compensate an electric property difference caused by a height difference of the semiconductor layers.

Referring again to FIG. 1C, to read a selected memory cell, a voltage of 0 volts may be applied to a selected wordline WL(i, j), a read voltage $V_{READ}$ may be applied to unselected wordlines WL(I', j), a selected ground selection line GSL(i), and/or a selected string selection line SSL(i), and/or a precharge voltage $V_{PCHR}$ may be applied to a selected bitline BL(k) (I' being an integer between 1 and L, and J being an integer between 1 and M, not j). A voltage of 0 volts may be applied to an unselected ground selection line GSL(I), an unselected string selection line SSL(I), a common source line CSL, and/or a selected semiconductor layer (I being an integer between 1 and L, not i).

For example, if a voltage of 0 volts is applied to the selected wordline WL(i,j), a voltage level of the selected bitline BL(k) may be varied depending on an amount of charge accumulated in the selected memory cell. The voltage level variation measured by a sensing circuit may indicate the information stored in the selected memory cell.

According to an example embodiment described with reference to FIGS. 2A and 2B, a wordline WL formed on a desired, or alternatively, a predetermined semiconductor layer may have equipotentiality with a$^h$ corresponding wordline WL formed on another semiconductor layer. Therefore, wordlines WL may be differentiated not by the order of semiconductor layers, but only by the order of the wordlines WL at respective semiconductor layers. Accordingly, the wordlines WL may be represented using a 1-dimensional coordinate. For example, as illustrated in FIG. 2C, program, erase, and read operations may be performed similarly to those described with reference to FIG. 1C. For example, although corresponding wordlines of the semiconductor layers have equipotentiality, an unselected string selection line SSL(I) and an unselected ground selection line GSL(I) may be connected to a voltage of 0 volts or may be in a floating state, as illustrated in FIG. 2C. Accordingly, memory cells of an unselected semiconductor layer may not be undesirably selected during program and read operations.

Accordingly, decoder circuits connected to the wordlines WL may decrease in number according to an example embodiment as illustrated in FIGS. 2A and 2B. For a NAND flash memory device according to an example embodiment illustrated in FIGS. 1A and 1B, a required number of decoder circuits may be equivalent to the multiplication of the number L of semiconductor layers by the number M of wordlines arranged at the respective semiconductor layers. However, in FIGS. 2A and 2B, the required number of decoder circuits may be equivalent to the number M of wordlines arranged at only one semiconductor layer.

According to an example embodiment described with reference to FIGS. 3A and 3B, selection lines, e.g., a GSL and a SSL, formed on a desired, or alternatively, a predetermined semiconductor layer may have equipotentiality with selection lines, e.g., a GSL and a SSL, formed on another semiconductor layer. Accordingly, the selection of a desired, or alternatively, a predetermined memory cell may be performed by selecting a wordline WL and a bitline BL (for example, not by selecting selection lines). For example, each wordline WL may be selected independently although string selection lines SSL and ground selection lines GSL of the semiconductor layers have their own equipotentiality. Accordingly, memory cells of unselected semiconductor layers may not be undesirably selected during program and read operations.

In FIGS. 3A and 3B, the operation conditions of the flash memory device may be identical to the voltage conditions described with reference to FIG. 1C, except that a voltage condition for unselected selection lines is not included. Similar to an example embodiment described with reference to FIGS. 1A and 1B, the number of decoder circuits required in FIGS. 3A and 3B may be equivalent to the multiplication of the number L of semiconductor layers by the number M of wordlines WL arranged at the respective semiconductor layers.

According to example embodiments, a NAND flash memory device may include memory cell transistors that are 3-dimensionally arranged using stacked semiconductor layers. Selection transistors may be 3-dimensionally arranged to select memory cell transistors. Therefore, memory cells may be selected according to the position of the semiconductor layer. Selection lines or corresponding wordlines of the respective semiconductor layers may have equipotentiality. Accordingly, decoder circuits configured to select a wordline or selection lines may decrease in number. Therefore, a more highly integrated flash memory device may be fabricated.

Although example embodiments have been shown and described in this specification and figures, it would be appreciated by those skilled in the art that changes may be made to the illustrated and/or described example embodiments without departing from their principles and spirit.

What is claimed is:

1. A memory device comprising:
   L semiconductor layers stacked sequentially and vertically, L being an integer greater than 1;
   a gate structure on each of the semiconductor layers;
   N bitlines on the gate structures and crossing over the gate structures, N being an integer greater than 1; and
   a common source line on each of the semiconductor layers, at least one of the common source lines interposed vertically between the semiconductor layers, each of the common source lines connected electrically to each other through a conductive plug therebetween such that the common source lines have equipotentiality with each other.

2. The memory device of claim 1, wherein
   each of the gate structures includes a string selection line, a ground selection line, and M wordlines between the string selection line and the ground selection line, M being an integer greater than 1, and
   the N bit lines cross over the string selection line, the ground selection line, and the wordlines of each gate structure over the uppermost semiconductor layer.

3. The memory device of claim 2, wherein
   each of the semiconductor layers includes at least N active regions in parallel with the bitlines,
   each of the active regions includes a source region and a drain region at opposite sides of the gate structure and internal impurity regions between the string and ground selection lines and the wordlines,
   the string selection line, the ground selection line, the wordlines, and the common source line cross the active regions in each of the semiconductor layers, and
   the source regions at the one side of the gate structure are electrically connected to each other by the common source line on each of the semiconductor layers.

4. The memory device of claim 3, further comprising:
   bitline plugs at the other side of the gate structure to electrically connect the bitlines to the drain regions at the other side of the gate structure.

5. The memory device of claim 2, wherein corresponding wordlines disposed on the respective semiconductor layers are connected to each other to have equipotentiality with each other.

6. The memory device of claim 5, wherein programming a memory cell selected by a wordline and a bitline of one of the semiconductor layers comprises:
applying a turn-on voltage and a turn-off voltage to the string selection line and the ground selection line of a selected semiconductor layer, respectively;
applying the turn-off voltage to the string and ground selection lines of unselected semiconductor layers;
applying a program voltage to a selected wordline;
applying a pass voltage to unselected wordlines;
applying a bitline voltage lower than the program voltage to a selected bitline;
applying an unselected bitline voltage higher than the selected bitline voltage and lower than the program voltage to unselected bitlines; and
applying a common source line voltage higher than a ground voltage and lower than a power supply voltage to the common source lines,
wherein corresponding wordlines of the semiconductor layers are connected to an equivalent voltage.

7. The memory device of claim 5, wherein reading a memory cell selected by a wordline and a bitline of one of the semiconductor layers comprises:
applying a read voltage to the string and ground selection lines of a selected semiconductor layer and unselected wordlines;
applying a turn-off voltage to the string and ground selection lines of unselected semiconductor layers;
applying a voltage of 0 volts to a selected wordline; and
applying a precharge voltage to a selected bitline,
wherein corresponding wordlines of the semiconductor layers are connected to an equivalent voltage.

8. The memory device of claim 2, wherein
the string selection lines disposed on the respective semiconductor layers are connected to each other to have equipotentiality with each other; and
the ground selection lines disposed on the respective semiconductor layers are connected to each other to have equipotentiality with each other.

9. The memory device of claim 8, wherein programming a memory cell selected by a wordline and a bitline of one of the semiconductor layers comprises:
applying a turn-on voltage and a turn-off voltage to each of the string selection lines and each of the ground selection lines, respectively;
applying a program voltage to a selected wordline of a selected semiconductor layer;
applying a pass voltage to unselected wordlines;
applying a selected bitline voltage lower than the program voltage to a selected bitline;
applying an unselected bitline voltage, which is a voltage higher than the selected bitline voltage and lower than the program voltage, to unselected bitlines; and
applying a common source line voltage, which is higher than a ground voltage and lower than a power supply voltage, to the common source lines.

10. The memory device of claim 8, wherein reading a memory cell selected by a wordline and a bitline of one of the semiconductor layer comprises:
applying a read voltage to the string and ground selection lines and unselected wordlines of a selected semiconductor layer;
applying a voltage of 0 volts to a selected wordline; and
applying a voltage of 0 volts to wordlines of an unselected semiconductor layer;
applying a precharge voltage to a selected bitline,
wherein the read voltage is equivalently applied to the string selection lines and the ground selection lines of the selected semiconductor layer.

11. The memory device of claim 2, wherein programming a memory cell selected by a wordline and a bitline of one of the semiconductor layers comprises:
applying a turn-on voltage to the string selection line of a selected semiconductor layer;
applying a turn-off voltage to the ground selection line of the selected semiconductor layer and the string and ground selection lines of unselected semiconductor layers;
applying a program voltage to a selected wordline of the selected semiconductor layer;
applying a pass voltage to unselected wordlines; and
applying a selected bitline voltage, which is lower than the program voltage, to a selected bitline.

12. The memory device of claim 11, wherein programming a memory cell selected by a wordline and a bitline of the semiconductor layer comprises:
applying an unselected bitline voltage, which is higher than the selected bitline voltage and lower than the program voltage, to unselected bitlines; and
applying a common source line voltage, which is higher than a ground voltage and lower than a power supply voltage, to the common source lines.

13. The memory device of claim 12, wherein
the turn-on voltage is the power supply voltage;
the program voltage is between about 10 and 20 volts;
the pass voltage is lower than the program voltage;
the selected bitline voltage is 0 volts; and
the unselected bitline voltage is the power supply voltage.

14. The memory device of claim 2, wherein reading a memory cell selected by a wordline and a bitline of one of the semiconductor layer comprises:
applying a read voltage to the string and ground selection lines of a selected semiconductor layer and unselected wordlines of the selected semiconductor layer;
applying a turn-off voltage to the string and ground selection lines of unselected semiconductor layers;
applying a voltage of 0 volts to a selected wordline of the selected semiconductor layer; and
applying a precharge voltage to a selected bitline.

15. The memory device of claim 1, wherein the semiconductor layers are connected to each other to have equipotentiality with each other.

16. The memory device of claim 1, wherein the semiconductor layers are connected to different upper interconnections such that different well biases are applied to the semiconductor layers.

* * * * *